(12) United States Patent
Fang et al.

(10) Patent No.: US 7,881,594 B2
(45) Date of Patent: Feb. 1, 2011

(54) HEATING SYSTEM AND METHOD FOR MICROFLUIDIC AND MICROMECHANICAL APPLICATIONS

(75) Inventors: Ming Fang, Plano, TX (US); Fuchao Wang, Plano, TX (US)

(73) Assignee: STMicroeletronics, Inc., Carrollton, TX (US)

( * ) Notice: Subject to any disclaimer, the term of this patent is extended or adjusted under 35 U.S.C. 154(b) by 187 days.

(21) Appl. No.: 12/005,862

(22) Filed: Dec. 27, 2007

(65) Prior Publication Data

US 2009/0169190 A1    Jul. 2, 2009

(51) Int. Cl.
  *F24H 1/10* (2006.01)
(52) U.S. Cl. .................................. 392/485
(58) Field of Classification Search .............. 392/485
  See application file for complete search history.

(56) References Cited

U.S. PATENT DOCUMENTS 7,122,767 B2 * 10/2006 Sato et al. ................ 219/497
  2003/0081064 A1 * 5/2003 Dante et al. ............. 347/48
  2003/0178410 A1 * 9/2003 Satoh ....................... 219/494
  2007/0081032 A1 * 4/2007 Silverbrook .............. 347/56
  2007/0081038 A1 * 4/2007 Worsman et al. .......... 347/61

OTHER PUBLICATIONS

Allen R. et al., "Thermodynamics and Hydrodynamics of Thermal Ink Jets", Hewlett-Packard Journal, May 1985, pp. 20-27.

* cited by examiner

*Primary Examiner*—Daniel Robinson
(74) *Attorney, Agent, or Firm*—David V. Carlson; Lisa K. Jorgenson

(57) ABSTRACT

An integrated semiconductor heating assembly includes a semiconductor substrate, a chamber formed therein, and an exit port in fluid communication with the chamber, allowing fluid to exit the chamber in response to heating the chamber. The integrated heating assembly includes a first heating element adjacent the chamber, which can generate heat above a selected threshold and bias fluid in the chamber toward the exit port. A second heating element is positioned adjacent the exit port to generate heat above a selected threshold, facilitating movement of the fluid through the exit port away from the chamber. Addition of the second heating element reduces the amount of heat emitted per heating element and minimizes thickness of a heat absorption material toward an open end of the exit port. Since such material is expensive, this reduces the manufacturing cost and retail price of the assembly while improving efficiency and longevity thereof.

13 Claims, 11 Drawing Sheets

HEATING SYSTEM AND METHOD FOR MICROFLUIDIC AND MICROMECHANICAL APPLICATIONS

BACKGROUND

1. Technical Field

The present disclosure relates to microchip heaters for microfluidic and micromechanical applications, and more particularly, to a multi layered heating element structure.

2. Description of the Related Art

Some fluids are processed at temperatures that need to be accurately regulated.

DNA amplification process (PCR, i.e., Polymerase Chain Reaction process) is one process in which accurate temperature control, including repeated specific thermal cycles, needs to be carried out, while avoiding thermal gradients in the fluid. Often, only very small amounts of fluid are used, either because of a small sample or the expense of the fluid. Microchip heaters are particularly suited for this application.

Other examples of fluid processing needing specific thermal characteristics include the implementation of chemical and/or pharmacological analyses, and biological examinations. Other situations that require an accurate, miniaturized heater include inkjet printers heaters and optical switching heaters, to name a few.

Current inkjet technology relies on placing a small amount of ink within an ink chamber, rapidly heating the ink and ejecting it to provide an ink drop at a selected location on an adjacent surface, such as a sheet of paper. Traditionally, ohmic resistors which heat up rapidly when current is passed therethrough have been used to provide the necessary temperature increase of the ink. See, for example, a detailed discussion of ink ejection in an article titled "Thermodynamics and Hydrodynamics of Thermal Ink Jets," by Allen et al., *Hewlett-Packard Journal*, May 1985, pp. 20-27, incorporated herein by reference.

Generally, present techniques for generating local heating in a microchip include heating elements that are positioned along one side of the object to be heated. The ink is required to be ejected from the reservoir toward its target, which requires raising the temperature of the heater high enough to eject the ink and maintain the ink in a heated state as it exits the microchip. the chamber must then cool rapidly so that new fluid can be inserted into the chamber at liquid temperatures. Since resistor temperatures may reach approximately 800 degrees Celsius, such devices often employ a thick metallic film at the edge of the chamber to serve as a heat sink for preventing high temperatures from adversely affecting the durability of the inkjet cartridge or printer components. The heat sinks are typically fabricated from valuable metals, such as gold. In some designs at least one gram of gold is used for each wafer of the semiconductor material. Accordingly, manufacturing large quantities of such devices requires large quantities of gold, significantly adding to the cost of manufacturing and the retail price of such devices.

BRIEF SUMMARY

An integrated semiconductor heating assembly has a plurality of heating elements adjacent the fluid to be heated. A chamber is formed in an integrated circuit which contains an inlet for fluid and an outlet. The fluid is of the type that needs to be heated to selected temperatures for a desired purpose, for example, an inkjet printer DNA amplification, chemical analysis, or other use.

A plurality of heating elements are positioned at different locations adjacent the chamber which contains the fluid. A first heating element is positioned near a bottom surface of the chamber in order to provide heat across the bottom surface, while a second heating element is positioned on the sides, top, or in both locations to provide additional heating of the fluid.

Each of the heating elements is individually sized and driven with a selected current (or voltage) to provide a desired amount of heat to the fluid based on their location adjacent the chamber and the desired temperature grading in the fluid. In some applications, the bottom heating element is larger and is heated to a higher temperature than a heating element on the top or the sides. Further, the timing of driving the heating elements is selected to produce a desired heating gradient in the fluid. For example, the bottom heating element may begin to heat first, followed by the side heating element, if one is present, after which the top heating element begins to heat.

The use of multiple heating elements, having the desired size and control circuitry, provides the advantage of heating the fluid quickly to a desired temperature without having to raise the heating element to an excessively high temperature and using less overall heat. It also provides the advantage of improved temperature control gradient throughout the fluid and rapid heating and cooling of the chamber.

BRIEF DESCRIPTION OF THE SEVERAL VIEWS OF THE DRAWINGS

FIGS. 2-12A, 13, and 14 are schematics of the integrated semiconductor heating assembly of FIG. 1 at different stages in a manufacturing process according to one embodiment.

DETAILED DESCRIPTION

The following discussion describes various embodiments of an integrated heating assembly 100, followed by a description of an embodiment of fabrication of the same. An integrated semiconductor heating assembly 100 is formed on a substrate 104.

Figure 1:
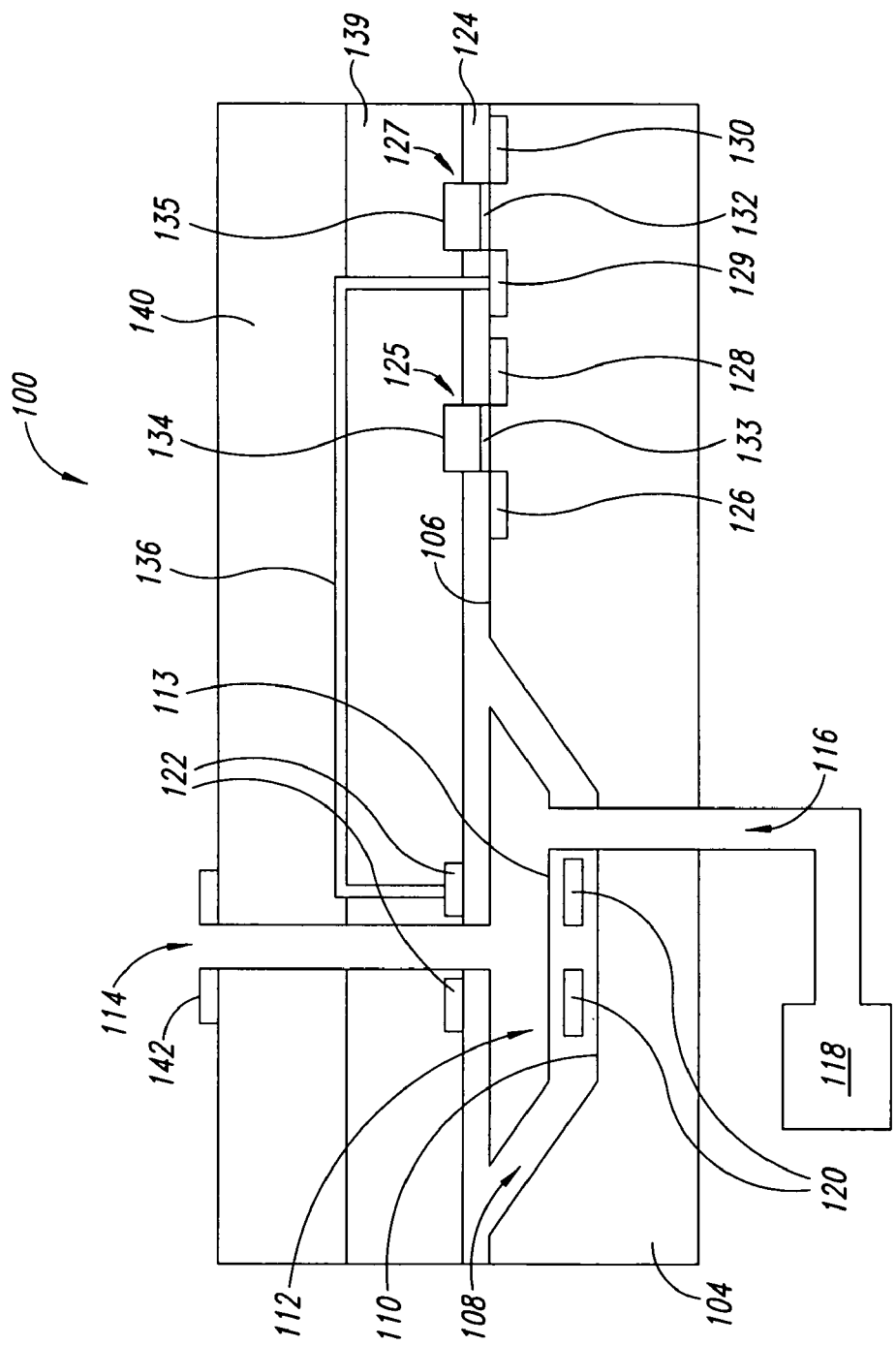
FIG. 1 is a schematic cross-section of an integrated semiconductor heating assembly according to one embodiment.

As shown in FIG. 1, the substrate 104 is monocrystalline semiconductor material, for example silicon. The substrate 104 includes an upper surface 106 and a recess 108 having a lower surface 110. Spaced from the lower surface 110, the integrated heating assembly 100 includes a chamber 112 having a lower surface 113. The chamber 112 is in fluid communication with an exit port 114 for allowing fluid communication between the chamber 112 and a surrounding environment. The chamber 112 is also in fluid communication with an inlet manifold 116, which is configured to introduce a fluid to the chamber 112 from a fluid source 118, externally located with respect to the integrated heating assembly 100.

The integrated heating assembly 100 includes a first heating element 120 positioned adjacent the lower surface 113 of the chamber 112.

The integrated heating assembly 100 further includes a second heating element 122 positioned adjacent the exit port 114 for selectively generating heat above a selected threshold to facilitate movement of the fluid through the exit port 114 away from the chamber 112.

The substrate 104 is protected and insulated with an insulating material 124, such as an oxide, a nitride, low stress nitride, or combinations thereof. Furthermore, the first and second heating elements 120, 122 generate heat by current supplied to them via first and second Metal-Oxide-Semiconductor Field-Effect Transistors (MOSFET) 125, 127, respectively. The first and second MOSFETs respectively include a source region 126, 129 and a drain region 128, 130 formed in the substrate 104 near an upper surface 106 thereof. A dielectric layer 132, 133, for example an oxide, is formed on the upper side 106 of the substrate 104, extending at least between the source region 126, 129 and the drain region 128, 130. Gate electrodes 134, 135 of the respective first and second MOSFETs are formed on the dielectric layers 132, 133 for controlling current as will be discussed in more detail below with respect to electrical communication between the MOSFETs and the heating elements of the integrated heating assembly 100. The substrate 104 can be doped with a desired conductivity type, either p-type or n-type. The dielectric layers 132, 133 may include a silicon dioxide, a silicon nitride, a sandwich layer of silicon dioxide/silicon nitride or some other combination of suitable dielectric material.

Electrical current from the first MOSFET 125 is supplied to the first heating elements 120 through a first vias and interconnect structure 141 (FIG. 12B) and the current from the second MOSFET 127 is supplied to the second heating element 122 through a second vias and interconnect structure 136.

The integrated heating assembly 100 also includes a dielectric layer 139 positioned adjacent the insulating material 124, and a passivation layer 140 positioned adjacent the dielectric layer 139. The outlet port 114 extends from the chamber through the insulation layer 124, dielectric layer 139, and the passivation layer 140, to open outside the chamber 112. A heat sink member 142 is positioned, if needed, to surround at least a portion of the exit port 114 toward the end that is open.

The heat sink member 142 is used if more rapid cooling is needed than the heating assembly 100 can provide without one. In some embodiments, no heat sink 142 is used. In some embodiments, it is positioned to reduce or eliminate an impact of the heat being generated by the integrated heating assembly 100 on components externally located with respect to the integrated heating assembly 100. Typically, the heat sink member 142 is fabricated from material that exhibits superior heat absorption and dissipation qualities. Such material is often selected from the metals group of materials, including gold, silver, or copper.

Existing art devices are known to incorporate relatively large amounts of gold, such as 1.5 grams of gold per wafer, as a heat sink. This is because as discussed above, these devices heat the fluid from one location which is distal with respect to the location at which the fluid exits the device. Accordingly, in existing devices, extremely high temperatures, such as 800° C., are applied to the chamber and fluid, which heats the entire surrounding region. This heat needs to be effectively absorbed to protect adjacent and external components, for example, other chambers, transistors, and components external to these heaters in an inkjet printer head. As a consequence, it is not uncommon that these prior art devices to require over one ounce of gold per manufacturing lot, which significantly adds to the cost of manufacturing and the end price.

In contrast, an integrated heating assembly according to embodiments of the present disclosure, such as the integrated heating assembly 100 discussed above, heat the fluid from two or more sides. In one embodiment, they also heat along and proximate to its route of travel through at least the chamber 112 and out the exit port 114. Accordingly, each individual heater, such as the first and second heating elements 120, 122 are heated to a lower temperature, such as 300° to 600° C., and emit a lesser amount of heat, thereby significantly reducing the thickness and/or weight requirement of the heat sink member 142 and reducing the cost of manufacture. In some embodiments of the invention, the heat sink 142 is not present.

The discussion that follows describes methods of manufacturing the integrated heating assembly 100 discussed above, according to various embodiments.

Figure 2:
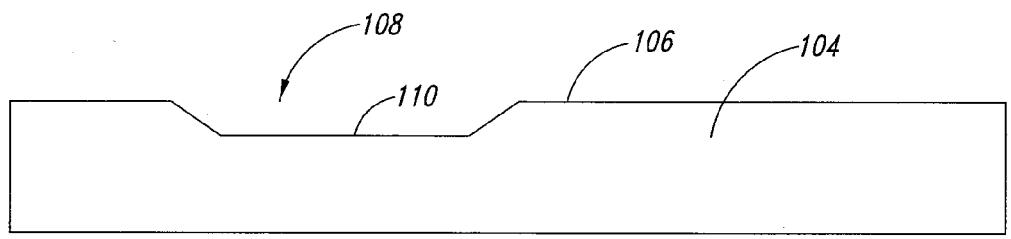

FIG. 2 illustrates the substrate 104 having an upper surface 106. A recess 108 is formed in the substrate 104 by etching or other acceptable technique. The formation of the recess 108 is done to provide space for forming and positioning of the chamber 112 (FIG. 1), but in some embodiments the recess 108 is not formed and the chamber 112 is above the substrate 104. The etching method used can include wet or dry etching methods, known in the art. Examples of wet etching methods include anisotropic and isotropic etching and examples of dry etching include reactive ion etching (RIE), deep reactive ion etching (DRIE), sputter etching, and vapor phase etching.

Figure 3:
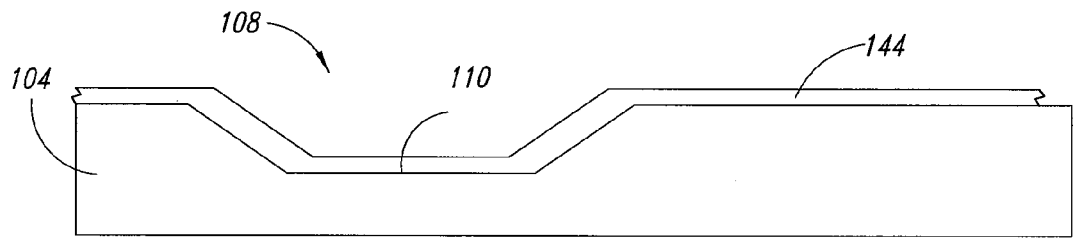

As illustrated in FIG. 3, on the substrate 104, including the recess 108, is deposited with a dielectric layer 144 on its upper surface 106. Instead of a deposition technique, in some embodiments, the dielectric 144 can be grown on the upper surface 106. The dielectric layer 144 electrically isolates the upper surface 106 of the substrate 104. It can be a material with desirable heat transfer properties to reduce heat from the heating element 120 (FIG. 1) spreading to substrate 104 around the chamber 112 (FIG. 1). One example of an acceptable dielectric is a nitride using a conformal deposition process as is known in the art. Nitride is deposited in a manner such that the profile of the recess 108 is substantially preserved, for example the nitride is deposited substantially conformally.

Figure 4:
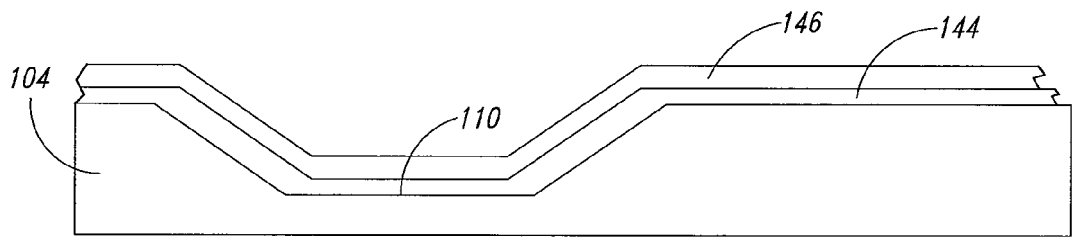
Figure 5:
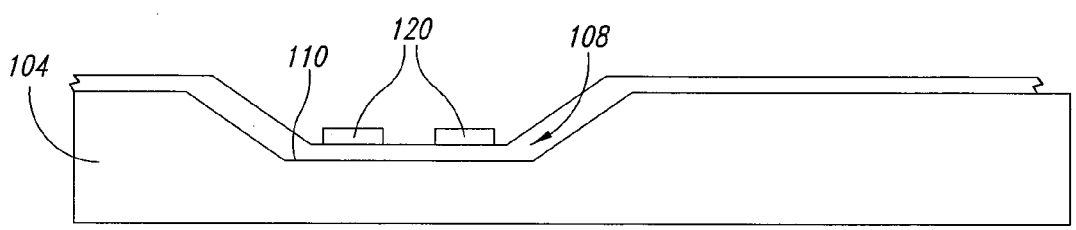

In one preferred embodiment, a pad oxide is grown, on top of which a nitride is deposited. The oxide maybe 20 to 100 Angstroms thick and the nitride from 50 to 3,000 Angstroms thick. The nitride may be deposited in layers, including a layer of low stress nitride. The underlying oxide may also be deposited. The layer 124 thus includes an oxide directly on the silicon, on top of which is deposited a nitride that is from 2 to 30 times thicker than the oxide. Next, as illustrated in FIG. 4, a heater layer 146 is deposited over the dielectric layer 144. The heater layer 146 can include any suitable material for use with semiconductors that produces heat from an electrical resistance. In some embodiments, it is preferable to use a resistive material that is also corrosion resistant. For example, in one embodiment, the heater layer 146 includes Tantalum (Ta), such as Tantalum Aluminum (TaAl). After deposition of the heater layer 146, this layer is etched or otherwise selectively removed to leave only portions of the heater layer 146, which form the first heating element 120, as illustrated in FIG. 5. The first heating element 120 is positioned above the lower surface 110 of the recess 108.

Figure 12A:
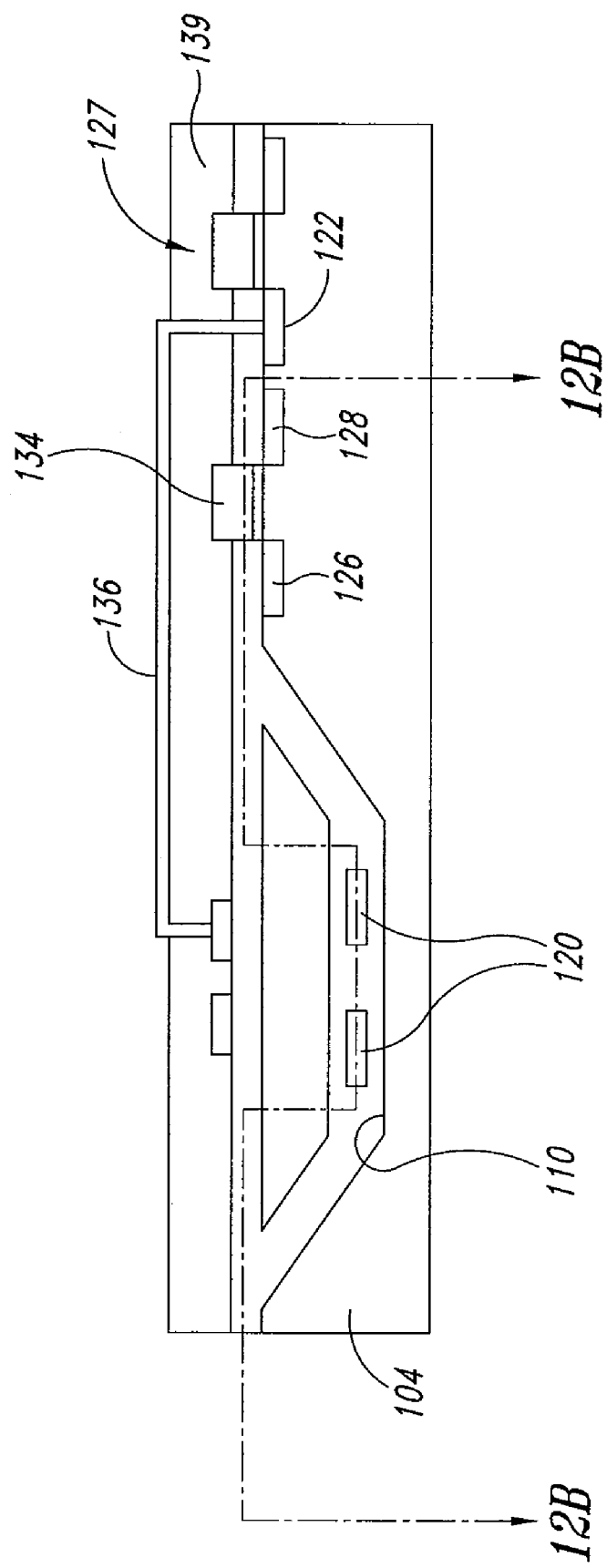
Figure 12B:
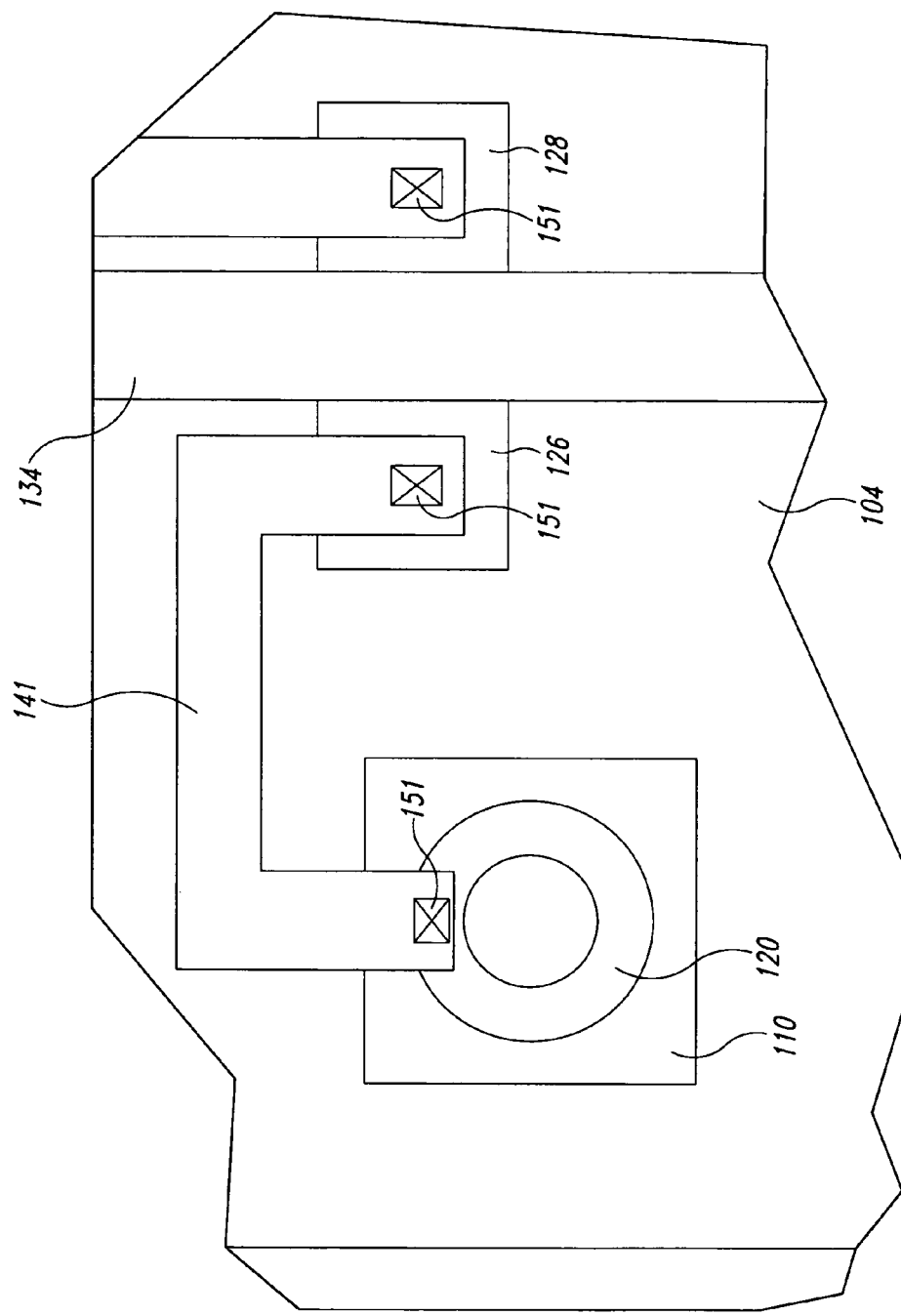
FIGS. 12B, 12C, and 12D are alternative embodiments of a heater shape.

The first heating element 120 can include any suitable shape that promotes consistent heating of the chamber 112 (FIG. 1). For example, the first heating element can be in the form of a torus shape, a hollow cylindrical shape, a solid shape, a square, a rectangle, a star with an opening in the center, a plurality of fingers, or any other suitable shape. In the illustrated embodiment of FIG. 5, the first heating element 120 includes a square-edged torus shape, a cross-section of which is shown in FIG. 12B.

Figure 6:
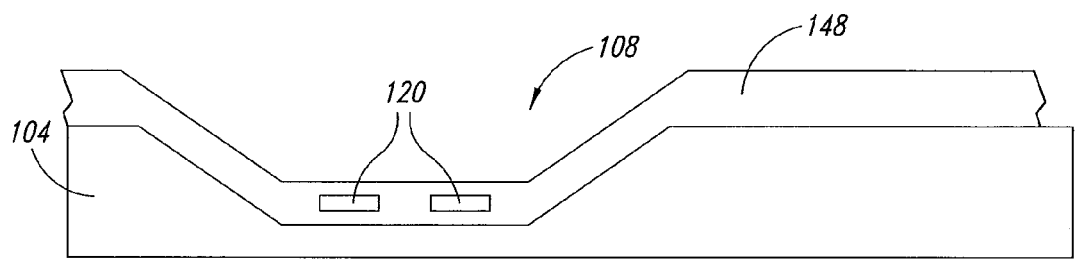

As illustrated in FIG. 6, once the first heating element 120 is formed, an insulation layer 148 is conformally applied to the wafer 102, covering the first heating element 120 and providing the bottom wall of chamber 112 (FIG. 1). The insulation layer 148 preferably includes a hard and durable material, which does not deteriorate despite its thickness and can be subjected to high temperatures. In one embodiment, the insulation layer 148 includes low-stress nitride, deposited using low stress nitride deposition methods as are known in the art. Layer 148 may also be a carbide or other inert, hard material. The layers 144 and 148 may merge at some locations to form a single layer. As shown in FIG. 6, this layer is conformally applied such that the profile of the recess 108 is substantially maintained.

Figure 7:
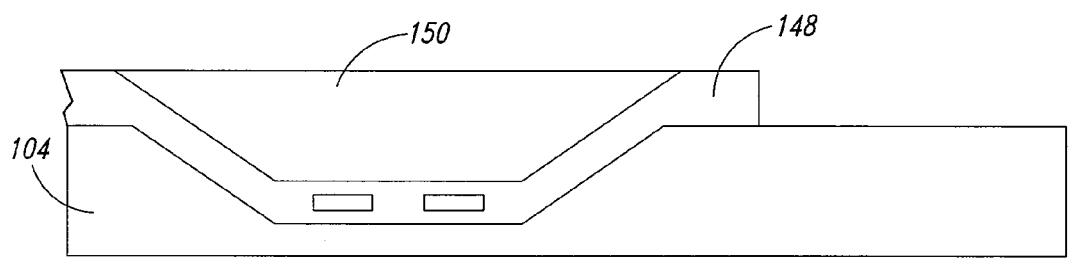

As illustrated in FIG. 7, after depositing the insulation layer 148, the recess 108 is filled with a sacrificial layer 150 which will later be removed to form the chamber 112 (FIG. 1). In one embodiment, the material used for the sacrificial layer 150 includes Tetraethyl orthosilicate (TEOS) or a TEOS Oxide. It may also be polysilicon used to form the gate electrodes 134, 135.

Figure 8:
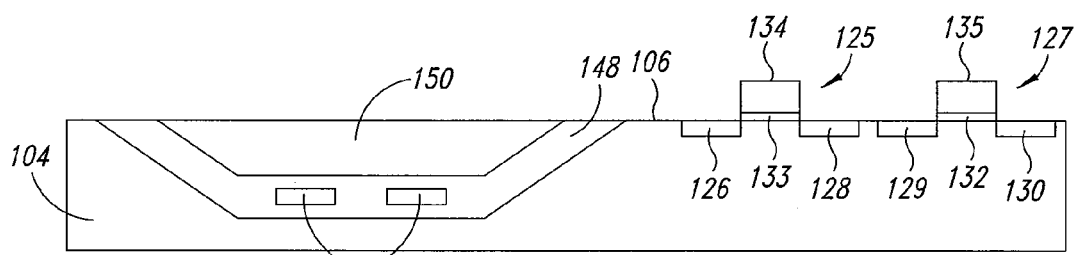

As also shown in FIG. 7, the insulation material 148 is etched or otherwise removed at a location spaced from the chamber 112 (FIG. 1). The existing layers are removed to expose the substrate 104 and facilitate formation of the first and second MOSFETs 125, 127, FIG. 8. The substrate 104 is processed using known MOSFET manufacturing techniques to form the respective source regions 126, 129 and drain regions 128, 130 of the MOSFETs 125, 127 in the substrate 104. The respective dielectric layers 132, 133, for example an oxide or an oxide nitride sandwich, are formed on the upper surface 106 of the substrate 104 and respective gate electrodes 134, 135 of the MOSFET are formed on the dielectric 132, 133.

The gate electrodes 134, 135 can be composed of any acceptable material, such as polysilicon, a polysilicon with a silicide layer thereon, or metal or any other conductive layer that is compatible with the process of an embodiment of the present disclosure. The process technology and steps for forming such are known. The MOSFET can be of any suitable type, such as LDMOS, VDMOS, etc.

The process for forming the control circuitry, including MOSFETs, on the same substrate as heating chambers are well known in the art and the details will therefore not be described. Any of the many known and widely practiced techniques for forming the MOSFETs and other circuits on the substrate 104 with the heating chamber 112 may be used.

In one embodiment, the polysilicon used to form the gate electrode is also used to form one layer of the sacrificial material 150. In this embodiment, the chamber region and the circuitry region are exposed to the polysilicon deposit at the same time.

In another embodiment, the formation of the circuitry region is performed in separate process steps from the heating chamber 112. In this embodiment, the region of substrate 104 that will include the circuitry is covered with the appropriate masks or passivation layers while different regions of the heating chamber 112 are being formed, then the circuitry region is uncovered and the process steps carried out to form the circuit components while the heating chamber region is covered with a mask or passivation layer. In this embodiment, the sacrificial layer 150 is made of selected material and patterned and etched to fill the chamber while the circuitry region is covered with a masking layer.

Figure 9:
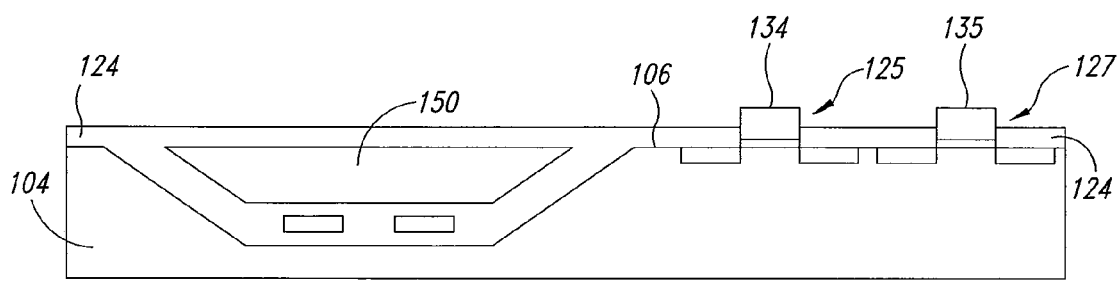

As illustrated in FIG. 9, a further insulating layer 124 is deposited to cover the substrate 104 and above the sacrificial layer 150. For example, the insulating material 124 can include low stress nitride, for reasons discussed above. The insulating layer 124 is a planarizing layer to cover and fill the areas over the circuitry region and to cover the sacrificial layer 150 with a relatively thin layer. Layers 144 and 148 are present in the structure of FIGS. 3-4 and 6-8, respectively, but are not shown in subsequent figures for ease of illustration. In one preferred embodiment, a nitride, a BPSG layer, PSG layer or combinations thereof are deposited and reflowed and then subjected to a CMP to planarize the layer 124. The region of layer 124 over the sacrificial layer 150 will have a thickness selected to provide heat transfer through the portion of layer 124 that remains around the chamber 112. Thus, the uppermost portion of layer 124 may be low stress nitride, even in other portions are planarizing sub-layers, such as BPSG or the like. The thickness is sufficient to provide a support ceiling layer over the chamber 112, but not so thick as to prevent heat transfer from the later to be formed heating element 122. A thickness in the range of 100 to 500 Angstroms is acceptable and the actual thickness may vary and be greater depending on the ceiling area of the chamber 112 over which it is suspended, the area of the heater 122, the amount of heat to be generated and how close the heater is to the exit port 114.

Figure 10:
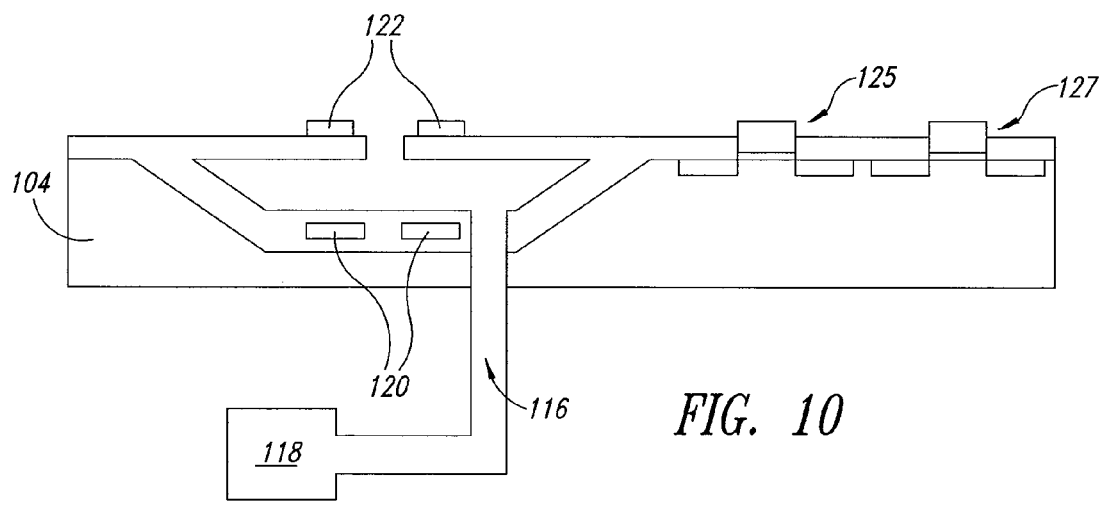

As illustrated in FIG. 10, above the insulating material 124, a heating layer, for example TaAl, is deposited and etched, which leaves behind only portions of the heating layer, which form the second heating element 122. The second heating element 122 is positioned above the chamber and, in one embodiment adjacent the location in which exit port 114 will be formed, as shown in FIG. 1 and described below.

The heater elements 120, 122, may be composed of different material besides TaAl. In one embodiment, the second heating element 122 is composed of polysilicon. The polysilicon can be deposited, if desired, in the same process step as the deposition of the poly gates 134 and 135. In this embodiment, when the poly gates 134 and 135 are doped, the polysilicon for the second heating element 122 will not be doped, so that it is comprised of intrinsic polysilicon. Alternatively, it may have very light levels of dopant of P or N so as to slightly increase the resistance and improve its properties as a heater. The thickness of the second heating element 122 when it is deposited as polysilicon may be different than the thickness of the poly gate, since its purpose is to function as a heater rather than as a highly conductive gate member. In such situations, even though both layers are poly, they may be deposited in separate steps.

The heaters 120 and 122, together with the other heaters later described herein, may also be made of other acceptable heater material. A high temperature metallic heater may be used such as an alloy that contains one or more of nickel, silver, molybdenum, in various combinations. A metal oxide, ceramic oxide, or other sophisticated resistive metal heater element may also be used.

Figure 11:
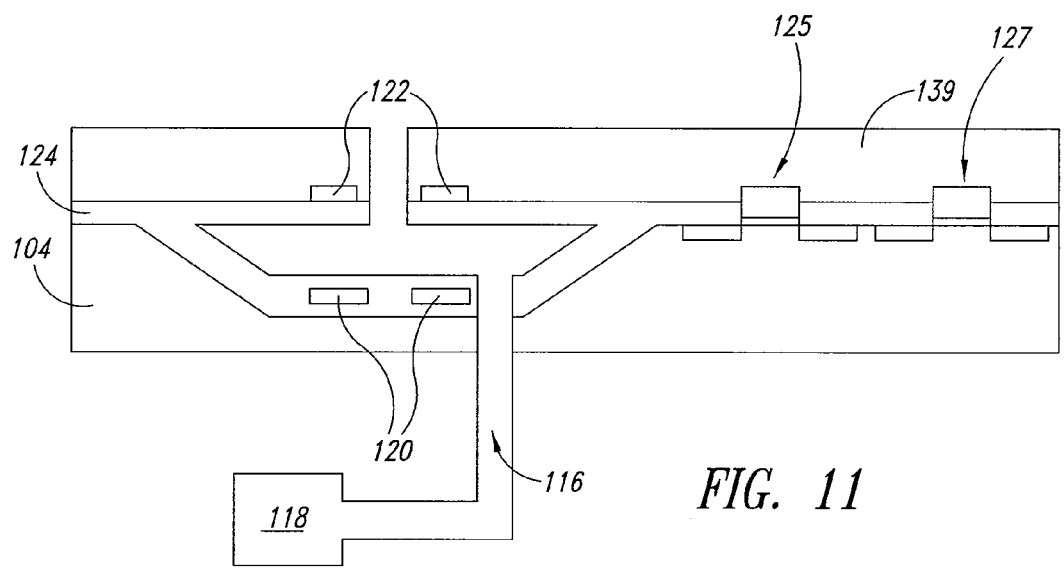

As illustrated in FIG. 11, a dielectric layer 139 is deposited over the insulation material 124, as is known in the art, for facilitating formation of the vias and interconnect structure 136 (FIG. 1). As illustrated in FIG. 12A, after, deposition of the dielectric layer 139, the appropriate vias and interconnect structure 136 is formed for carrying the heating current from the second MOSFET 125, 127 and the second heating element 122. For example, the vias and interconnect structure 136, can be formed by etching an opening in the insulating layers to expose the conductive layers to be connected. The opening can be filled with a conductive plug, such as tungsten, with a Ti/Ni liner, or filled with another acceptable conductor. This is followed by deposition of a conductive layer, such as a metal, for example doped aluminum, silicon doped copper, tungsten, or combinations thereof, followed by etching to create the conductive line 136. The conductive line 136 is selected to be of a material and size such that it will not significantly heat up while carrying the heating current to the heater element 122. The upper heating element 122 is preferably circular in shape and has less effective surface area than heater 120.

Conductive line 141 to carry heating current to the lower heater element 120 is formed in the same or a prior sequence of steps as the formation of the conductive line 136, as shown in FIG. 12B. The conductive line 141 is not shown in FIG. 1 or 12A since it is in a different plane that is not viewable in the those figures, but a top side view is shown in FIG. 12B which is top plan view taken along the line 12B-12B shown in FIG. 12A. As shown in FIG. 12B, the transistor 125 has a contact 151 made to the source or drain region and then it makes an electrical contact with the lower heater 120 inside the chamber 112.

One example of how the line 141 can be connected in shown in FIG. 12B, but other connections are also acceptable. For example, it may be coupled in the same plane as the heating element 120 and may be formed in the same series of process steps that form the heater element 120, so that it is below the insulating layer 148; alternatively, it can be above the insulating layer 148 and be electrically coupled through vias that extend through 2 or more insulating layers. There are many acceptable techniques to couple a lower heating element in the bottom of a chamber to a transistor that provides the heating current since this connection was commonly done in the prior art and any known technique that electrically couples the drive transistor 125 to the heating element 120 is acceptable.

Figure 12C:
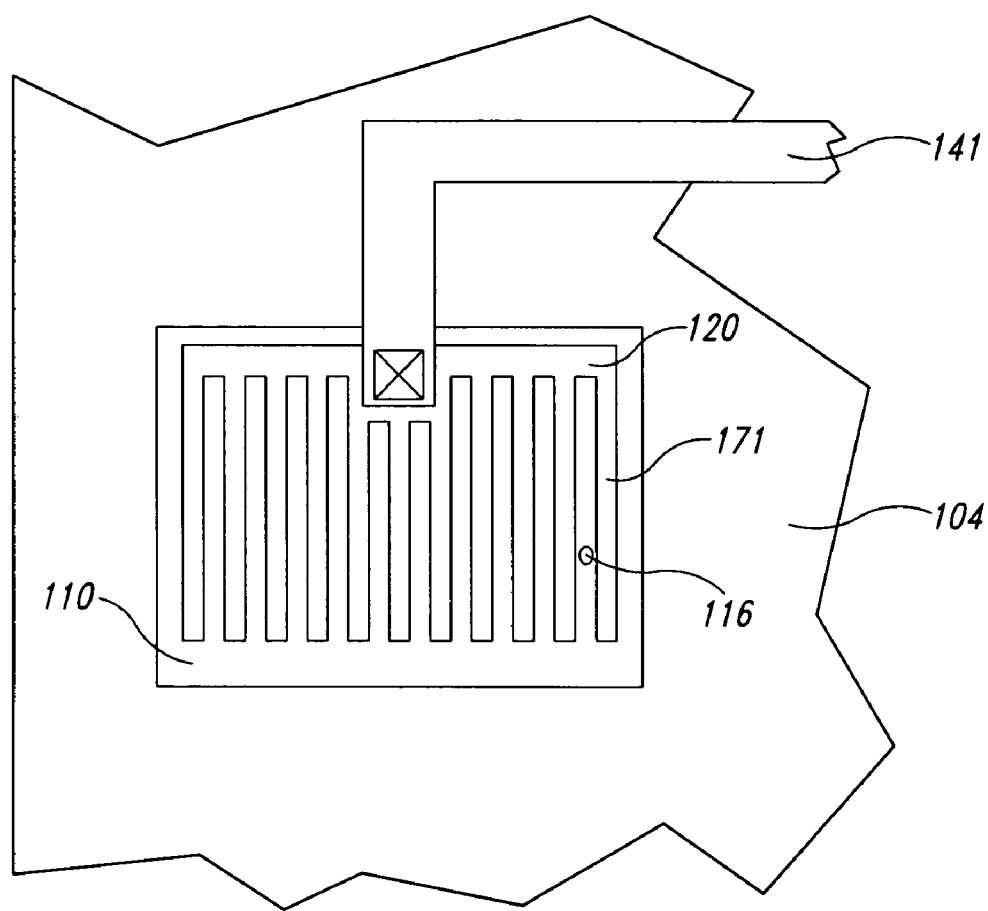
Figure 12D:
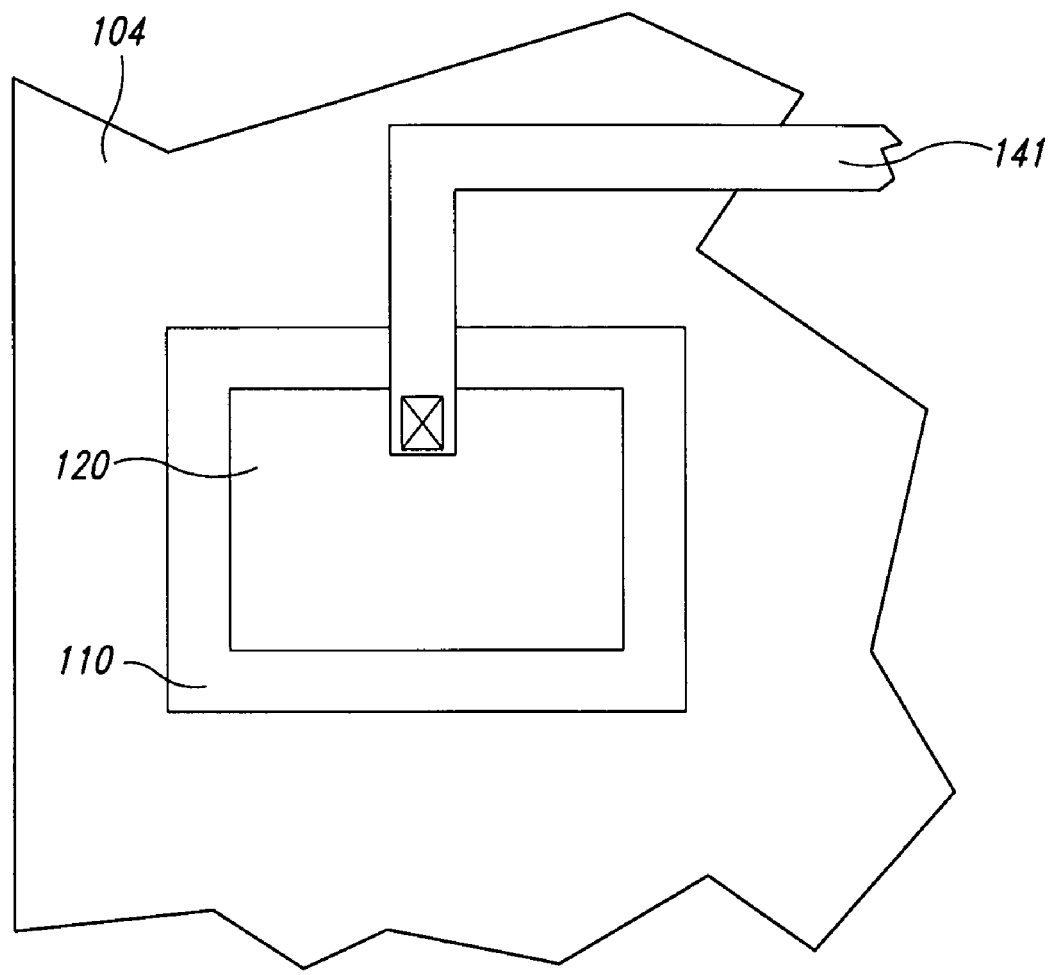

FIGS. 12C and 12D illustrate further alternative embodiments of the heater 120. In the embodiment of FIG. 12C, heater 120 is a comb heater with a plurality of fingers 171. The fingers 171 are spaced from each other and extend across the bottom of the chamber 112 to provide an even, complete heat across the entire bottom with good heat radiation properties. In some embodiments, one or more of the fingers 171 may be on either side of the aperture 116 so that the heat is evenly applied across the entire bottom of the chamber, even adjacent the sidewalls of the entry of the aperture 116, not drawn to scale in these figures. In other embodiments, the heater 120 has the fingers 171 positioned all on one side of the inlet 116 so that the two structures can be formed without having to be concerned about the relative spacing and potential interference between them.

FIG. 12D illustrates a further alternative embodiment of the heater 120 which includes a flat plate as the heating element. In this embodiment, a broad flat plate is used as the heating element to apply single consistent heat across the entire surface of the bottom of the chamber 112.

Figure 13:
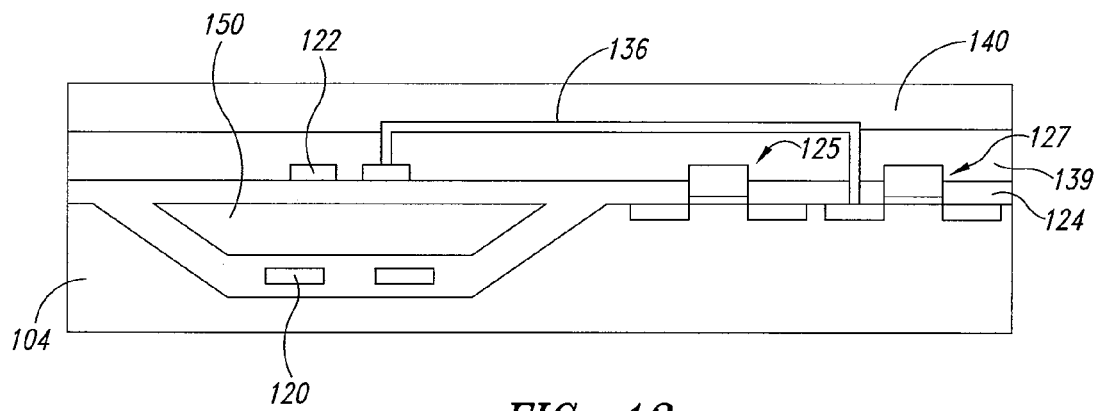
Figure 14:
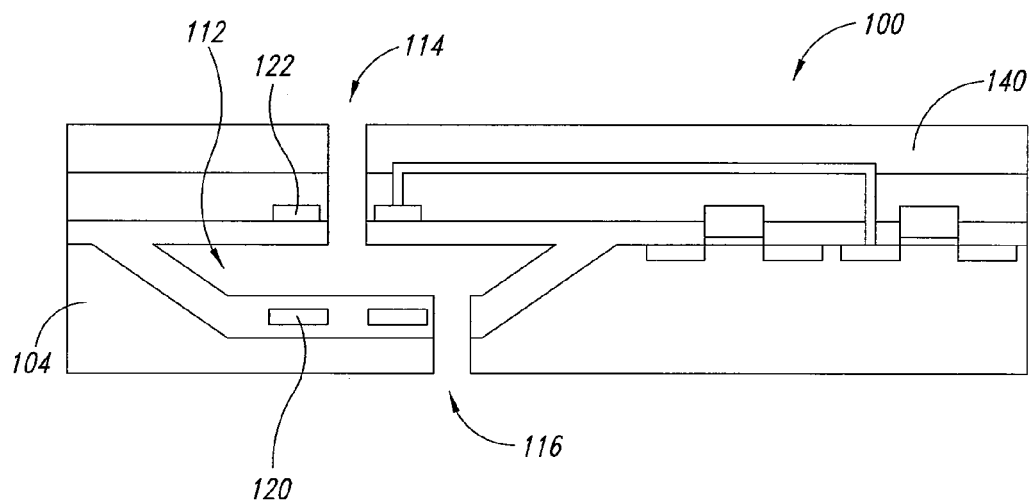

As illustrated in FIG. 13, a passivation layer 140 is applied over the dielectric layer 139, and the vias and interconnect structure 136, as is known in the art. As illustrated in FIG. 14, the exit port 114 and input manifold 116 are formed using known methods, which include etching steps, such as dry etching, wet etching, layer formation, deposition, lithography, potassium hydroxide etching, or a combinations thereof, during which process or processes the sacrificial layer 150 (FIG. 7) is removed thereby forming the chamber 112.

Namely, the layer 140 is masked and etched to provide the opening 114. Etching is then performed to remove the sacrificial layer 150 and leave the open chamber 112. The chamber 112 as shown has a trapezoidal shape with a somewhat larger area at the upper portion than at the bottom portion. Of course, the chamber 112 may have other shapes as appropriate for the circumstances. For example, in one embodiment, the chamber 112 has vertical sidewalls and is annular in shape. In other embodiments, the chamber 112 is in the form of a long tube with either cylindrical or curved sidewalls, a truncated cone, or other cone shape. The embodiment of a long tube or cone may be particularly beneficial for DNA amplification and other biological uses. In other embodiments, the chamber 112 is in the form of a prism, which may include various geometrical prism shapes, such as a cuboid, a right prism, an oblique prism, or other acceptable shapes depending on the particular fluids and the particular uses.

Furthermore, depending on the application and the corresponding heat that is expected to be generated from the first and second heating elements 120, 122, if a heat sink member is needed for heat absorption and control, then the heat sink member 142 is formed by deposition, pattern and etching. In many embodiments, a heat sink member 142 will not be needed, and in those situations in which one is needed, it will be smaller in size than was permitted in the prior art. The heat sink member 142 can be applied over the passivation layer 140, adjacent the exit port 114 toward an end thereof open to the surrounding environment. For example, a gold can be applied and etched, using lesser amounts of gold than is typically required in existing devices.

The operation of the heating device is as follows. When fluid in the chamber 112 is to be heated, the control circuitry individually activates transistors 125 and 127 to provide a desired amount of heating current to the respective heaters 120 and 122. Heating of the fluid by both elements provides more uniform heating of the entire body of fluid and more rapid heating then was possible in the prior art with a single heating element on one side only.

During operation, the chamber 112 is heated by heat generated by the first heating element 120 above a selected threshold, to heat the fluid entering the chamber 112 from the manifold 116, or stored in the chamber 112, and bias the fluid toward the exit port 114, for being projected out toward the surrounding environment.

The second heating element 122 proximally heats the traveling fluid as it moves away from the chamber, allowing heating of the heating elements 120, 122 at lower temperatures. Accordingly, the heat generated by each of the individual first and second heating elements 120, 122 can be lower in magnitude than a heater in existing prior art devices. Lower temperatures facilitate the longevity of the integrated heating assembly 100 components in addition to notably reducing the cost of manufacture, as described in more detail below.

The relative timing and amount of current provided to each of the heating elements is controlled individually for each element. The first heating element 120 is generally larger in surface area and rapidly heats the fluid from the bottom towards a target temperature. The fluid, as it is heated, may expand slightly, towards the exit port 114. Current is provided to the second heating element 122, which further heats the fluid and facilitates its exit from the exit port 114. The use of two heaters reduces the total amount of heat that must be applied to the ink to cause it reach the desired target temperature. The presence of the second heater also reduces the amount of heat that needs to be generated by the first heating element 120 and also reduces the current flow that must be provided to the first heating element. If the target temperature of the fluid at ejection is 300° C., then each heater may need to reach a temperature of around 350° C. to properly heat the fluid, as compared to the prior art in which the single heater needed to reach temperatures in the range of 700° C. to 800° C. to be assured of the entire fluid volume reaching the proper temperature at ejection. This also provides for faster cycling of the heating and cooling steps.

The timing of providing heating current to the heaters 120 and 122 can be selected according to a preferred use. In one embodiment, both heaters have current applied at the same time and both heat towards the target temperature on the same cycle. In an alternative embodiment, the heating time is offset for the two heaters. The lower heater 120 may begin to heat and then at a later time, such as a few microseconds or 100 nanoseconds later, the upper heater 122 may begin to heat. The heat cycles start at different times from each other. They may heat at different rates or towards different end temperatures. This will provide for more efficient heating and movement of the fluid out of the chamber.

Accordingly, when the fluid in the chamber 112 (FIG. 1) is heated by the first heating element 120 and biased toward the exit port 114, the second heating element 122 facilitates its ejection from the exit port 114, reducing the amount of heat that needs to be generated by the first heating element 120.

The amount of current, which is applied to the first and second heating elements 120, 122, or the resistance or size of the first and second heating elements 120, 122, can differ so that distinct levels of heat can be generated by the first and second heating elements 120, 122. Therefore, different regions of the chamber 112 can be heated at a different temperature than heating at the exit port 114. This can especially be desirable in certain applications.

For the example of an inkjet printer application, the printer head can include the integrated heating assembly 100. In this instance, the fluid source 118 can be an ink source configured to supply ink via manifold 116 to the chamber 112. The first heating element 120 heats the ink, for example by being heated to the range of 350° C. to 500° C. biasing the ink toward the exit port 114, which forms a nozzle in this case. As the ink travels toward and through the nozzle, the second heating element 122 maintains the ink in the heated state or may add some heat, to facilitate its ejection toward a target element, such as a sheet of paper.

In one embodiment, the second heating element 122 can be heated to 300° C. Since the ink is heated at different stages along its travel path toward the paper, excessive heat from a distal source is unnecessary when the ink reaches the nozzle, and thus a thermal mass at the exit is not needed. If one is needed, the thickness of the gold plating, which serves as a heat sink can be significantly reduced. Furthermore, since the overall operating temperature of the printer head is less, the components thereof are less prone to failure due to heat damage and fatigue based on drastic heat cycling.

Additional heating elements may be placed along this path or at different locations adjacent the chamber 112.

Figure 15:
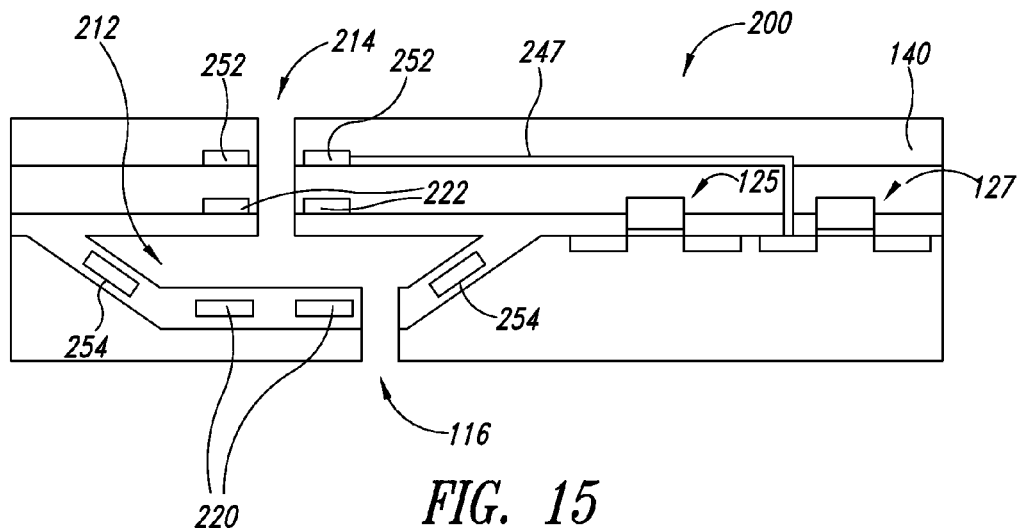
FIG. 15 is a schematic cross-section of an integrated semiconductor heating assembly according to another embodiment.

In another embodiment as illustrated in FIG. 15, an integrated heating assembly 200 includes third and fourth heating elements 252, 254, in addition to the first and second heating elements 220, 222. The third heating element 252 is coupled to conductor 247 and positioned between the second heating element 222 and an open end of the exit port 214 toward the surrounding environment such that the fluid can be heated further or more consistently, and in some embodiments, at lesser heat per heating element. For example, the second heating element 222 can operate at 250° C. while the third heating element 252 operates at 150° C., further reducing the need for a heat sink adjacent the exit port. Given the lower temperatures that are needed in this embodiment, no heat sink is needed and thus one is not shown.

As illustrated in FIG. 15, the heating elements can be vertically positioned or vertically stacked with respect to each other. As can be seen, heating element 220 is the lowest of the stack, and heating element 254 is positioned above and in this embodiment to the side of heating element 220. It is thus in a second vertical position above the vertical position of heating element 220. Heating elements 222 and 252 are also vertically above heating element 220. With respect to these two heating elements, they are vertically stacked directly above each other and, in this embodiment also vertically above the heating element 220. Thus, in this particular arrangement it forms a vertical stack, with each of the heating elements in different horizontal planes, but being vertically aligned with each other such as heating elements 222 and 252, or having some vertical plane which is overlapped between the heating elements such as 220 and 222, which, although they overlap, do not align at one or both edges.

Alternatively, or in addition, the fourth heating element 254 can be positioned such that it extends adjacent a lateral periphery of the chamber 212, assisting the first heating element 220 in heating the chamber 212. In such an embodiment, the first heating element 220 can operate at even lesser temperatures since it is being aided by the fourth heating element 254. For example, the first heating element 220 can be heated to 300 degrees Celsius while the fourth heating element 254 is heated to 250° C. The alternative embodiments of FIGS. 15 and 16 are particularly beneficial for DNA amplification. In such uses, precise temperature control of the fluids is important over a range of temperatures. At some stages, the fluid needs to be quite hot to anneal the DNA, while it cannot exceed the temperature at which the fluid becomes denatured. The fluid must be heated and cooled for a series of cycles over a range of temperatures, as is known in the art. In some applications, the temperature of the fluid must range from a high of 90° C. to 80° C., to a lower range, for example 60° C. to 50° C. with various temperatures higher and lower being required at different times in the cycle. The use of multiple heaters on the chamber is benefit to provide precise controls with rapid response and less of a temperature gradient in the fluid. Having a uniform temperature throughout the entire fluid is important in some DNA amplification applications, and the use of the multiple heaters is beneficial to provide a uniform temperature gradient. Further, in DNA amplification, it is not desired to eject the fluid from the port by overheating it, so the heaters may be positioned differently to achieve the uniform heating that is desired.

Figure 16A:
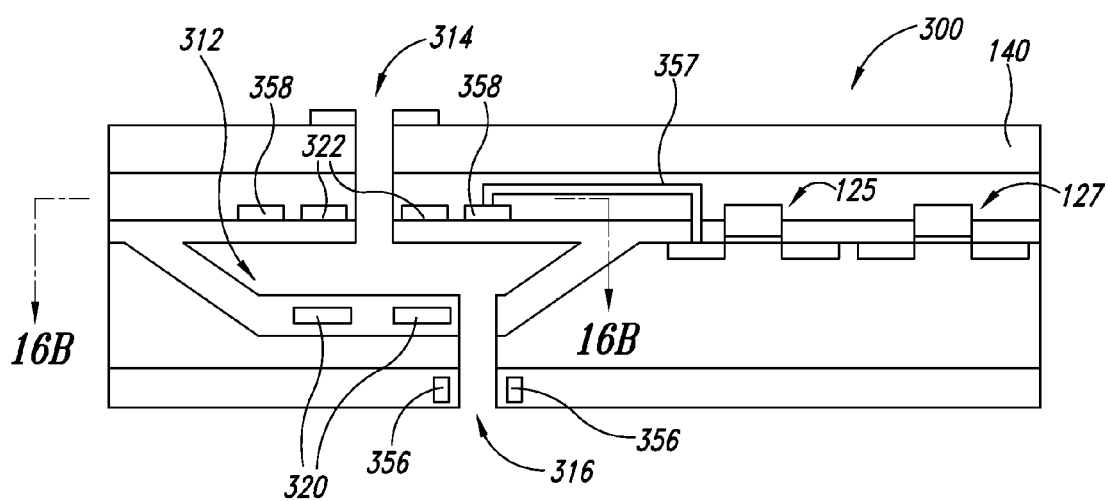
FIG. 16A is a schematic cross-section of an integrated semiconductor heating assembly according to yet another embodiment.
Figure 16B:
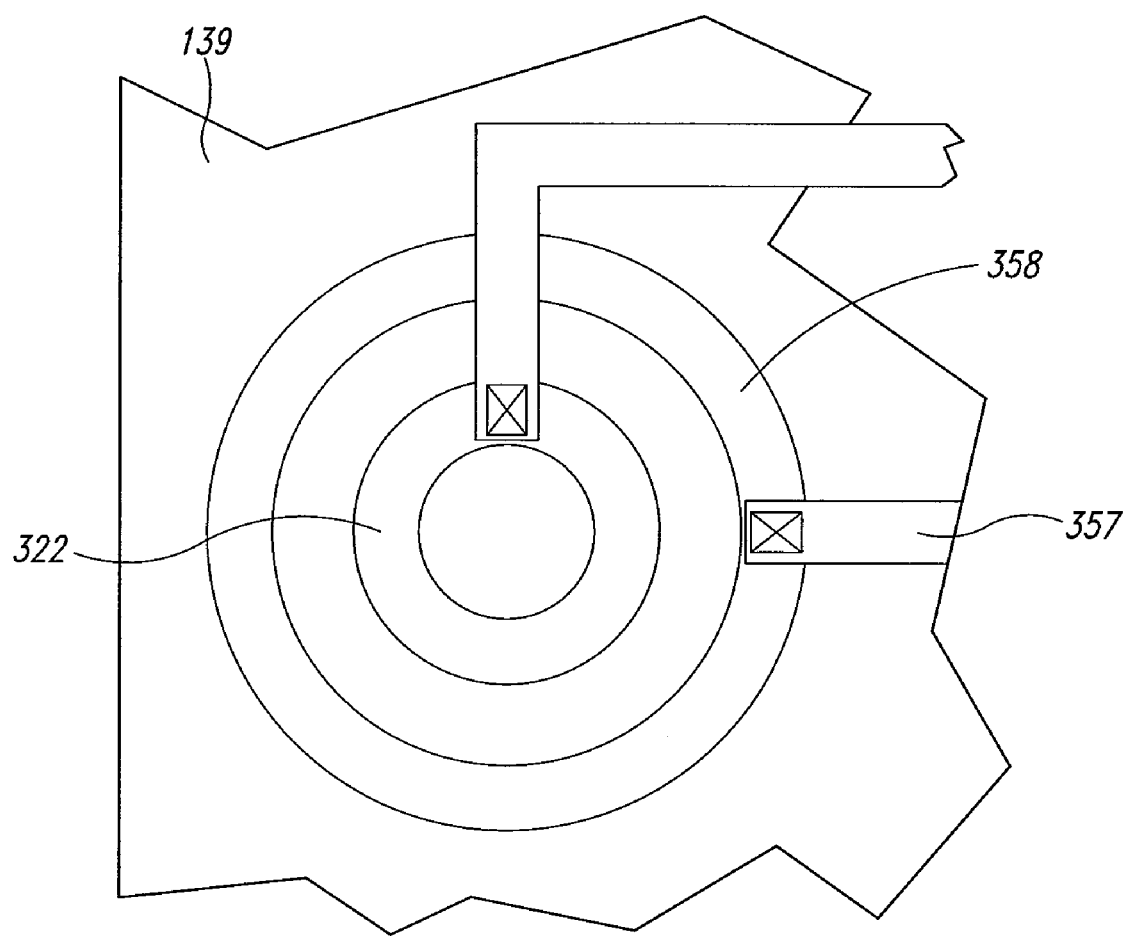
FIG. 16B is a top view of a portion of the integrated semiconductor heating assembly of FIG. 16A, viewed along section 16B-16B.

In yet another embodiment as illustrated in FIGS. 16A and 16B, an integrated heating assembly 300 can include a heating element 356 positioned adjacent or surrounding the manifold 316, to preheat the fluid as it is entering the chamber 312. In this embodiment, the heating element 356 will further reduce the level of heat required to be generated by the first and second heating elements 320, 322 because a temperature difference between a heated state of the fluid and a state at which the fluid is in when it enters the chamber 312 is less as compared to when the fluid is not preheated.

The heating element 356 may also be advantageous in the embodiments with different viscosities of fluid which enter the chamber. Some fluids may have a viscosity which makes it difficult for them to flow smoothly into a small orifice or into a small channel. Having the heating element 356 positioned near the inlet of the small orifice heating the fluid, even if slight, reduces the viscosity and provides a more even flow of the fluid into the chamber 312. This may advantageously permit more rapid filling of the chamber 312, since the fluid may smoothly flow in and reduce or void altogether any clogs or plugs which may occur. Even for fluids which would easily flow into the chamber 312, the use of the additional heater 356 at the inlet may sufficiently increase the rate at which the chamber can be filled. Additionally, its presence is advantageous as a preheating element to permit the fluid to more easily move through the orifice 316. If desired, a minimum low heat may be maintained on the fluid by having the heater 320 at a very low heat temperature, thus maintaining the fluid having a constant viscosity as that which it had when it entered the chamber. Alternatively, the fluid may be permitted to cool, increasing its viscosity and thus making it more easy to keep the fluid within the chamber and reduce the likelihood that some may leak out of either orifice 314 or 316.

Furthermore, the heating elements can be arranged in any desirable order or configuration. For example, a heating element 358 can be positioned adjacent the second heating element 322, such that the second heating element 322 is concentric with respect to the heating element 358. In such an example, the heating element 358 contributes to heating the chamber 312 from above in addition to assisting the second heating element 322 in maintaining the fluid heated as it travels through the exit port 314. A conductive line 357 carries the heating current from the transistor 125 to the heating element 358.

These examples are provided to demonstrate that other variable and multiple heating configurations are possible and fall within the scope of the claims that follow. Various modifications and combinations of the heater arrangements shown herein can be made that fall within the scope of the invention. For example, the heaters as shown in FIGS. 15 and 16A may be combined with each other in various modifications. Alternatively, one or more of the heaters from FIG. 15 may be used in a structure with one or more of the heaters from FIG. 16A so as to form a heater having some combination of vertically or horizontally positioned heaters with respect to each other. Further, any of the heating elements discussed herein may include a transistor such as a thin film transistor.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated semiconductor heating assembly comprising:
    a semiconductor substrate;
    a chamber formed in the semiconductor substrate and including a bottom;
    an inlet path in fluid communication with the chamber and configured to receive fluid;
    an outlet path in fluid communication with the chamber and configured to allow fluid communication between the inlet path, the chamber, and a surrounding environment; and
    a first heating element positioned adjacent the chamber bottom and configured to heat to a temperature above a selected threshold, a second heating element positioned adjacent the outlet path and configured to heat to a temperature above a selected threshold.

2. The integrated semiconductor heating assembly of claim 1, further comprising:
    a transistor disposed in the semiconductor substrate; and
    an electrical connection from the transistor to the first heating element to control the conducting of electrical current through the first heating element.

3. The semiconductor heating assembly of claim 1, further comprising:
    a passivation layer configured to separate the second heating element from the surrounding environment.

4. The semiconductor heating assembly of claim 3, further comprising:
    a heat sink member positioned adjacent the outlet path.

5. The semiconductor heating assembly of claim 1 wherein the second heating element surrounds a region of the outlet path.

6. An integrated semiconductor heating assembly comprising:
    a semiconductor substrate;
    a chamber formed in the semiconductor substrate, the chamber having a bottom;
    an inlet path in fluid communication with the chamber and configured to receive fluid;
    an outlet path in fluid communication with the chamber and configured to allow fluid communication between the inlet path, the chamber, and a surrounding environment; and
    a first heating element positioned adjacent the chamber bottom and configured to heat to a temperature above a selected threshold, a second heating element positioned adjacent the outlet path and configured to heat to a temperature above a selected threshold, and a third heating element positioned adjacent the inlet path.

7. The semiconductor heating assembly of claim 6 wherein the first, second, and third heating elements are configured to emit a distinct magnitude of heat to the chamber, the outlet path, and the inlet path, respectively.

8. An integrated semiconductor heating assembly comprising:
    a semiconductor substrate;
    a chamber formed in the semiconductor substrate, the chamber having a bottom;
    an inlet path in fluid communication with the chamber and configured to receive fluid;
    an outlet path in fluid communication with the chamber and configured to allow fluid communication between the inlet path, the chamber, and a surrounding environment; and
    a first heating element positioned adjacent the chamber bottom and a second heating element positioned adjacent the outlet path.

9. The integrated semiconductor heating assembly of claim 8, further comprising:

a transistor disposed in the semiconductor substrate; and an electrical connection from the transistor to the first heating element to control an electrical current through the first heating element.

10. The semiconductor heating assembly of claim 8, further comprising a passivation layer overlying the second heating element and configured to separate the second heating element from the surrounding environment.

11. The semiconductor heating assembly of claim 10, further comprising a heat sink member positioned overlying the passivation layer and positioned adjacent the outlet path.

12. The semiconductor heating assembly of claim 8, further comprising a third heating element positioned overlying the second heating element and positioned adjacent the outlet path.

13. The integrated semiconductor heating assembly of claim 1, further comprising a third heating element adjacent sidewalls of the chamber.

* * * * *